United States Patent
Papanu et al.

(10) Patent No.: US 9,165,832 B1
(45) Date of Patent: Oct. 20, 2015

(54) METHOD OF DIE SINGULATION USING LASER ABLATION AND INDUCTION OF INTERNAL DEFECTS WITH A LASER

(71) Applicants: James S. Papanu, San Rafael, CA (US); Wei-Sheng Lei, San Jose, CA (US); Jungrae Park, Santa Clara, CA (US); Alexander Lerner, San Jose, CA (US); Brad Eaton, Menlo Park, CA (US); Ajay Kumar, Cupertino, CA (US)

(72) Inventors: James S. Papanu, San Rafael, CA (US); Wei-Sheng Lei, San Jose, CA (US); Jungrae Park, Santa Clara, CA (US); Alexander Lerner, San Jose, CA (US); Brad Eaton, Menlo Park, CA (US); Ajay Kumar, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/320,419

(22) Filed: Jun. 30, 2014

(51) Int. Cl.
| | |
|---|---|
| *H01L 21/00* | (2006.01) |
| *H01L 21/78* | (2006.01) |
| *H01L 21/304* | (2006.01) |
| *H01L 21/268* | (2006.01) |
| *H01L 21/683* | (2006.01) |

(52) U.S. Cl.
CPC ............. *H01L 21/78* (2013.01); *H01L 21/268* (2013.01); *H01L 21/3043* (2013.01); *H01L 21/6836* (2013.01)

(58) Field of Classification Search
CPC ........................................................ H01L 21/00
USPC .................................. 438/462; 257/E21.532
See application file for complete search history.

(56) References Cited

U.S. PATENT DOCUMENTS

| | | |
|---|---|---|
| 4,049,944 A | 9/1977 | Garvin et al. |
| 4,339,528 A | 7/1982 | Goldman |
| 4,684,437 A | 8/1987 | Donelon et al. |
| 5,336,638 A | 8/1994 | Suzuki et al. |
| 5,543,365 A | 8/1996 | Willis et al. |
| 5,593,606 A | 1/1997 | Owen et al. |

(Continued)

FOREIGN PATENT DOCUMENTS

| | | |
|---|---|---|
| EP | 2258512 | 12/2010 |
| JP | 9216085 | 8/1997 |

(Continued)

OTHER PUBLICATIONS

Yang, Lih-Mei et al., "2 um femtosecond fiber laser at low repetition rate and high pulse energy," Optics Express, vol. 20, No. 5, Feb. 27, 2012, pp. 5683-5688.

(Continued)

*Primary Examiner* — Caleb Henry
(74) *Attorney, Agent, or Firm* — Blakely Sokoloff Taylor Zafman LLP

(57) ABSTRACT

A method and system of hybrid laser dicing are described. In one embodiment, a method includes focusing a laser beam inside a substrate in regions between integrated circuits, inducing defects inside the substrate in the regions. The method involves patterning a surface of the substrate with a laser scribing process in the regions after inducing the defects in the substrate. The method further involves singulating the integrated circuits at the regions with the induced defects. In another embodiment, a system includes a first laser module configured to focus a laser beam inside a substrate in regions between integrated circuits, inducing defects inside the substrate in the regions. A second laser module is configured to pattern a surface of the substrate with a laser scribing process in the regions after inducing the defects. A tape extender is configured to stretch tape over which the substrate is mounted, singulating the integrated circuits.

20 Claims, 11 Drawing Sheets

(56) References Cited

U.S. PATENT DOCUMENTS

| | | | |
|---|---|---|---|
| 5,691,794 A | 11/1997 | Hoshi et al. | |
| 6,051,503 A | 4/2000 | Bhardwaj et al. | |
| 6,057,180 A | 5/2000 | Sun et al. | |
| 6,174,271 B1 | 1/2001 | Kosmowski | |
| 6,300,593 B1 | 10/2001 | Poweli | |
| 6,306,731 B1 | 10/2001 | Igarashi et al. | |
| 6,407,363 B2 | 6/2002 | Dunsky et al. | |
| 6,420,245 B1* | 7/2002 | Manor | 438/460 |
| 6,426,275 B1 | 7/2002 | Arisa | |
| 6,465,158 B1 | 10/2002 | Sekiya | |
| 6,528,864 B1 | 3/2003 | Arai | |
| 6,574,250 B2 | 6/2003 | Sun et al. | |
| 6,582,983 B1 | 6/2003 | Runyon et al. | |
| 6,593,542 B2 | 7/2003 | Baird et al. | |
| 6,642,127 B2 | 11/2003 | Kumar et al. | |
| 6,676,878 B2 | 1/2004 | O'Brien et al. | |
| 6,696,669 B2 | 2/2004 | Hembree et al. | |
| 6,706,998 B2 | 3/2004 | Cutler | |
| 6,734,083 B2 | 5/2004 | Kobayashi | |
| 6,737,606 B2* | 5/2004 | Peng et al. | 219/121.68 |
| 6,759,275 B1 | 7/2004 | Lee et al. | |
| 6,803,247 B2 | 10/2004 | Sekiya | |
| 6,887,804 B2 | 5/2005 | Sun et al. | |
| 6,992,026 B2 | 1/2006 | Fukuyo et al. | |
| 6,998,571 B2 | 2/2006 | Sekiya et al. | |
| 7,128,806 B2 | 10/2006 | Nguyen et al. | |
| 7,129,150 B2 | 10/2006 | Kawai | |
| 7,179,723 B2 | 2/2007 | Genda et al. | |
| 7,265,033 B2 | 9/2007 | Shigematsu et al. | |
| 7,361,990 B2 | 4/2008 | Lu et al. | |
| 7,364,986 B2 | 4/2008 | Nagai et al. | |
| 7,435,607 B2 | 10/2008 | Nagai | |
| 7,459,377 B2 | 12/2008 | Ueda et al. | |
| 7,468,309 B2 | 12/2008 | Shigematsu et al. | |
| 7,473,866 B2 | 1/2009 | Morishige et al. | |
| 7,507,638 B2 | 3/2009 | Mancini et al. | |
| 7,507,639 B2 | 3/2009 | Nakamura | |
| 7,547,613 B2 | 6/2009 | Fukuyo et al. | |
| 7,566,637 B2* | 7/2009 | Farooq et al. | 438/462 |
| 7,626,138 B2 | 12/2009 | Bovatsek et al. | |
| 7,629,228 B2 | 12/2009 | Haji et al. | |
| 7,678,670 B2 | 3/2010 | Arita et al. | |
| 7,687,740 B2 | 3/2010 | Bruland et al. | |
| 7,696,012 B2 | 4/2010 | Nakamura | |
| 7,727,861 B2* | 6/2010 | Michalk et al. | 438/462 |
| 7,754,584 B2 | 7/2010 | Kumakawa | |
| 7,767,551 B2 | 8/2010 | Arita et al. | |
| 7,767,554 B2* | 8/2010 | Arita et al. | 438/462 |
| 7,772,090 B2* | 8/2010 | Starkston et al. | 438/462 |
| 7,776,720 B2 | 8/2010 | Boyle et al. | |
| 7,804,043 B2 | 9/2010 | Deshi | |
| 7,838,316 B2* | 11/2010 | Masui | 438/46 |
| 7,838,323 B2 | 11/2010 | Utsumi et al. | |
| 7,859,084 B2 | 12/2010 | Utsumi et al. | |
| 7,875,898 B2 | 1/2011 | Maeda | |
| 7,906,410 B2 | 3/2011 | Arita et al. | |
| 7,923,351 B2 | 4/2011 | Arita | |
| 7,926,410 B2 | 4/2011 | Bair | |
| 7,927,973 B2 | 4/2011 | Haji et al. | |
| 7,955,955 B2* | 6/2011 | Lane et al. | 438/465 |
| 8,039,283 B2* | 10/2011 | Hasegawa et al. | 438/46 |
| 8,048,778 B1* | 11/2011 | Ku et al. | 438/462 |
| 8,110,442 B2* | 2/2012 | Jinbo | 438/114 |
| 8,216,867 B2* | 7/2012 | Donofrio et al. | 438/33 |
| 8,324,636 B2* | 12/2012 | Hamaguchi et al. | 257/79 |
| 8,361,883 B2* | 1/2013 | Fukuyo et al. | 438/460 |
| 8,361,885 B2* | 1/2013 | Yoshizumi et al. | 438/462 |
| 8,364,304 B2 | 1/2013 | Starkston et al. | |
| 8,399,281 B1* | 3/2013 | Patterson et al. | 438/68 |
| 8,420,419 B2* | 4/2013 | Takagi et al. | 438/33 |
| 8,728,849 B1* | 5/2014 | Mattos et al. | 438/68 |
| 8,809,166 B2 | 8/2014 | Buenning et al. | |
| 8,828,306 B2* | 9/2014 | Uchiyama | 264/482 |
| 8,883,614 B1* | 11/2014 | Lei et al. | 438/460 |
| 8,883,615 B1* | 11/2014 | Holden et al. | 438/462 |
| 8,895,345 B2* | 11/2014 | Akiyama | 438/68 |
| 2002/0031899 A1 | 3/2002 | Manor | |
| 2003/0162313 A1 | 8/2003 | Kim et al. | |
| 2004/0080045 A1 | 4/2004 | Kimura et al. | |
| 2004/0137700 A1 | 7/2004 | Sekiya | |
| 2004/0157457 A1 | 8/2004 | Xu et al. | |
| 2004/0212047 A1 | 10/2004 | Joshi et al. | |
| 2005/0009235 A1* | 1/2005 | Swenson et al. | 438/113 |
| 2006/0043535 A1 | 3/2006 | Hiatt | |
| 2006/0086898 A1 | 4/2006 | Cheng et al. | |
| 2006/0088984 A1 | 4/2006 | Li et al. | |
| 2006/0146910 A1 | 7/2006 | Koochesfahani et al. | |
| 2006/0148211 A1 | 7/2006 | Iwasaki et al. | |
| 2006/0205182 A1 | 9/2006 | Soejima | |
| 2006/0220183 A1 | 10/2006 | Asai et al. | |
| 2007/0066044 A1 | 3/2007 | Abe et al. | |
| 2007/0093041 A1* | 4/2007 | Tanaka et al. | 438/463 |
| 2007/0105345 A1 | 5/2007 | Kurosawa | |
| 2007/0207594 A1 | 9/2007 | Tamura | |
| 2007/0272668 A1 | 11/2007 | Albelo et al. | |
| 2008/0096368 A1 | 4/2008 | Sakai | |
| 2008/0194079 A1* | 8/2008 | Yamamoto et al. | 438/462 |
| 2008/0230874 A1* | 9/2008 | Yamada et al. | 257/620 |
| 2008/0299745 A1 | 12/2008 | Morikazu | |
| 2009/0137097 A1* | 5/2009 | Lin et al. | 438/462 |
| 2009/0170288 A1* | 7/2009 | Ito | 438/462 |
| 2009/0215245 A1 | 8/2009 | Nakamura | |
| 2009/0255911 A1 | 10/2009 | Krishnaswami et al. | |
| 2010/0013036 A1 | 1/2010 | Carey | |
| 2010/0081255 A1* | 4/2010 | Poonjolai | 438/462 |
| 2010/0173474 A1* | 7/2010 | Arita et al. | 438/462 |
| 2010/0248451 A1 | 9/2010 | Pirogovsky et al. | |
| 2011/0059596 A1* | 3/2011 | Li et al. | 438/462 |
| 2011/0147897 A1 | 6/2011 | Varela et al. | |
| 2011/0287608 A1* | 11/2011 | Saegusa et al. | 438/462 |
| 2011/0298084 A1 | 12/2011 | Tamemoto | |
| 2011/0300691 A1* | 12/2011 | Sakamoto et al. | 438/462 |
| 2011/0304007 A1* | 12/2011 | Watanabe | 257/506 |
| 2011/0312157 A1* | 12/2011 | Lei et al. | 438/462 |
| 2012/0108035 A1 | 5/2012 | Kim et al. | |
| 2012/0156816 A1 | 6/2012 | Okamura et al. | |
| 2012/0196426 A1 | 8/2012 | Lim | |
| 2012/0244681 A1* | 9/2012 | Grivna et al. | 438/462 |
| 2012/0322235 A1* | 12/2012 | Lei et al. | 438/462 |
| 2012/0322239 A1 | 12/2012 | Singh et al. | |
| 2012/0322240 A1* | 12/2012 | Holden et al. | 438/462 |
| 2012/0329246 A1* | 12/2012 | Finn | 438/462 |
| 2013/0045554 A1 | 2/2013 | Yamazaki | |
| 2013/0065378 A1 | 3/2013 | Johnson et al. | |
| 2013/0203239 A1* | 8/2013 | Fadeyev et al. | 438/462 |
| 2013/0230972 A1 | 9/2013 | Johnson et al. | |
| 2013/0280890 A1 | 10/2013 | Lei et al. | |
| 2013/0323908 A1* | 12/2013 | Wang et al. | 438/462 |
| 2013/0337633 A1* | 12/2013 | Seddon | 438/462 |
| 2013/0344683 A1* | 12/2013 | Lazerand et al. | 438/462 |
| 2014/0015109 A1 | 1/2014 | Lei et al. | |
| 2014/0017879 A1* | 1/2014 | Chowdhury et al. | 438/462 |
| 2014/0017882 A1 | 1/2014 | Lei et al. | |
| 2014/0038392 A1 | 2/2014 | Yonehara et al. | |
| 2014/0051232 A1* | 2/2014 | Burghout et al. | 438/460 |
| 2014/0051233 A1* | 2/2014 | Agarwal et al. | 438/462 |
| 2014/0054797 A1 | 2/2014 | Gong et al. | |
| 2014/0084426 A1* | 3/2014 | Kiyota et al. | 257/620 |
| 2014/0106542 A1* | 4/2014 | Chowdhury et al. | 438/462 |
| 2014/0127880 A1* | 5/2014 | Grivna | 438/458 |
| 2014/0145294 A1 | 5/2014 | Moeller et al. | |
| 2014/0154871 A1 | 6/2014 | Hwang et al. | |
| 2014/0179084 A1 | 6/2014 | Lei et al. | |
| 2014/0213041 A1 | 7/2014 | Lei et al. | |
| 2014/0213043 A1 | 7/2014 | Van der Stam | |
| 2014/0252375 A1 | 9/2014 | Briere | |

FOREIGN PATENT DOCUMENTS

| | | |
|---|---|---|
| JP | 10321908 | 12/1998 |
| JP | 2001127011 | 5/2001 |
| JP | 2001144126 | 5/2001 |
| JP | 2003179005 | 6/2003 |
| JP | 2004031526 | 1/2004 |

(56) References Cited

FOREIGN PATENT DOCUMENTS

| JP | 2004055684 | 2/2004 |
|---|---|---|
| WO | WO-03036712 | 5/2003 |
| WO | WO-03071591 | 5/2003 |

OTHER PUBLICATIONS

Ohmura, Etsuji, "Temperature Rise of Silicon Due to Absorption of Permeable Pulse Laser," Osaka University, Japan, 18 pages.

Slobodtchikov, Evgueni, "The progress in near and mid-IR ultrafast laser systems at Q-Peak," DEPS Ultrafast Workshop 2009, 27 pages.

Raghunathan, Varun et al, "Nonlinear absorption in silicon and the prospects of mid-infrared silicon Raman lasers," phys. stat. sol. (a) 203, No. 5, 2006, pp. R38-R40.

Hoult, Tony, "Understanding processing with thulium fiber lasers," Nov. 27, 2013, retrieved via Internet at http://www.industrial-lasers.com/articles/print/volume-28/issue-6/features/understanding-processing-with-thulium-fiber-lasers.html, 12 pages.

Restriction Requirement mailed Sep. 29, 2014, in U.S. Appl. No. 14/326,018, 6 pages.

Linder, V. et al., "Water-Soluble Sacrificial Layers for Surface Micromachining", www.small-journal.com, 2005, 1, No. 7, 7 pgs.

Singh, Saravjeet et al., "Apparatus and Methods for Dry Etch With Edge, Side and Back Protection", U.S. Appl. No. 61/491,693, filed May 31, 2011 24 pgs.

Yang, Kate, "The application of stealth dicing in the field of smart card", Chins Integrated Circuit (CIC), No. 3, 2013, pp. 54-56, http://cicmag.com.

"Stealth Dicing Technology and Applications", Technical Information Bulletin, Hamamatsu, Mar. 2005.

Chen, W. T. et al., "Processing TSV wafer with stealth dicing technology", IEEE Catalog Number: CFP1259B-ART, pp. 271-273, 2012.

Kumagai, M., et al., "Advanced Dicing Technology for Semiconductor Wafer", IEEE Trans. Semi. Manuf., 20, pp. 259-265, 2007.

Non-Final Office Action for U.S. Appl. No. 14/320,405 mailed Oct. 7, 2014, 13 pages.

Non-Final Office Action for U.S. Appl. No. 14/320,390 mailed Sep. 29, 2014, 7 pages.

Notice of Allowance for U.S. Appl. No. 14/320,405 mailed May 7, 2015, 8 pages.

Notice of Allowance for U.S. Appl. No. 14/320,390 mailed Mar. 27, 2015, 7 pages.

Final Office Action for U.S. Appl. No. 14/457,782, mailed May 13, 2015, 20 pages.

Non-Final Office Action for U.S. Appl. No. 14/326,018 mailed Dec. 12, 2014, 10 pages.

Final Office Action for U.S. Appl. No. 14/326,018 mailed Mar. 20, 2015, 15 pages.

Office Action mailed Oct. 23, 2014, in U.S. Appl. No. 14/457,782, 16 pages.

\* cited by examiner

METHOD OF DIE SINGULATION USING LASER ABLATION AND INDUCTION OF INTERNAL DEFECTS WITH A LASER

BACKGROUND

1) Field

Embodiments of the present invention pertain to the field of semiconductor processing and, in particular, to methods of dicing semiconductor wafers, each wafer having a plurality of integrated circuits thereon.

2) Description of Related Art

In semiconductor wafer processing, integrated circuits are formed on a wafer (also referred to as a substrate) composed of silicon or other semiconductor material. In general, layers of various materials which are either semiconducting, conducting or insulating are utilized to form the integrated circuits. These materials are doped, deposited and etched using various well-known processes to form integrated circuits. Each wafer is processed to form a large number of individual regions containing integrated circuits known as dice or dies.

Following the integrated circuit formation process, the wafer is "diced" to separate the individual die from one another for packaging or for use in an unpackaged form within larger circuits. The two main techniques that are used for wafer dicing are scribing and sawing. With scribing, a diamond tipped scribe is moved across the wafer surface along pre-formed scribe lines. These scribe lines extend along the spaces between the dies. These spaces are commonly referred to as "streets." The diamond scribe forms shallow scratches in the wafer surface along the streets. Upon the application of pressure, such as with a roller, the wafer separates along the scribe lines. The breaks in the wafer follow the crystal lattice structure of the wafer substrate. Scribing can be used for wafers that are about 10 mils (thousandths of an inch) or less in thickness. For thicker wafers, sawing is presently the preferred method for dicing.

With sawing, a diamond tipped saw rotating at high revolutions per minute contacts the wafer surface and saws the wafer along the streets. The wafer is mounted on a supporting member such as an adhesive film stretched across a film frame and the saw is repeatedly applied to both the vertical and horizontal streets. One problem with either scribing or sawing is that chips and gouges can form along the severed edges of the dies. In addition, cracks can form and propagate from the edges of the dies into the substrate and render the integrated circuit inoperative. Chipping and cracking are particularly a problem with scribing because only one side of a square or rectangular die can be scribed in the direction of the crystalline structure. Consequently, cleaving of the other side of the die results in a jagged separation line. Because of chipping and cracking, additional spacing is often required between the dies on the wafer to prevent damage to the integrated circuits. Such additional spacing can keep the chips and cracks at a distance from the actual integrated circuits. As a result of the spacing requirements, not as many dies can be formed on a standard sized wafer and wafer real estate that could otherwise be used for circuitry is wasted. The use of a saw exacerbates the waste of real estate on a semiconductor wafer. The blade of a typical saw is approximately 15 μm thick. As such, to insure that cracking and other damage surrounding the cut made by the saw does not harm the integrated circuits, three to five hundred μm often must separate the circuitry of each of the dies. Furthermore, after cutting, each die requires substantial cleaning to remove particles and other contaminants that result from the sawing process.

Another dicing technique is referred to as "stealth dicing." In stealth dicing, an infrared laser beam is focused inside a silicon substrate to generate defects or cracking. Then, the dies may be singulated by the application of tensile forces along the laser induced cracks. However, existing stealth dicing techniques may result in unwanted crack propagation, chipping, and delamination.

SUMMARY

Embodiments of the present invention are directed to hybrid laser dicing. In an embodiment, a method of dicing a substrate comprising a plurality of integrated circuits involves focusing a laser beam inside the substrate in regions between the integrated circuits, inducing defects inside the substrate in the regions. The method involves patterning a surface of the substrate with a laser scribing process in the regions. The method further involves singulating the integrated circuits at the regions with the induced defects.

According to one embodiment, a method includes focusing a laser beam inside the semiconductor wafer in regions between the integrated circuits, inducing defects inside the semiconductor wafer in the regions. The method involves forming one or more grooves in a device layer of the semiconductor wafer with a laser scribing process in the regions after inducing the defects in the semiconductor wafer. The method further involves singulating the integrated circuits at the regions with the induced defects and the one or more grooves.

In one embodiment, a system for dicing a substrate comprising a plurality of integrated circuits (ICs) includes a first laser module configured to focus a laser beam inside the substrate in regions between the integrated circuits, inducing defects inside the substrate in the regions. A second laser module is configured to pattern a surface of the substrate with a laser scribing process in the regions. A tape extender is configured to stretch tape over which the substrate is mounted, singulating the integrated circuits at the regions with the induced defects.

BRIEF DESCRIPTION OF THE DRAWINGS

Embodiments of the present invention are illustrated by way of example, and not by way of limitation, and can be more fully understood with reference to the following detailed description when considered in connection with the figures in which.

DETAILED DESCRIPTION

Figure 1:
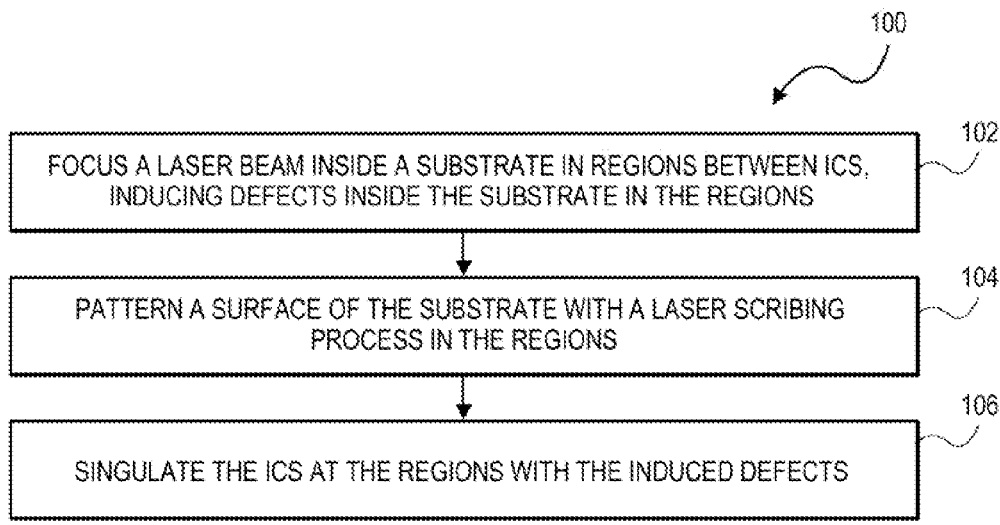
FIG. 1 is a flowchart representing operations in a method of hybrid laser dicing a substrate including a plurality of integrated circuits, in accordance with an embodiment of the present invention.

Methods of dicing semiconductor wafers, each wafer having a plurality of integrated circuits thereon, are described. In the following description, numerous specific details are set forth, such as exemplary laser scribing processes, in order to provide a thorough understanding of embodiments of the present invention. It will be apparent to one skilled in the art that embodiments of the present invention may be practiced without these specific details. In other instances, well-known aspects, such as integrated circuit fabrication, are not described in detail in order to not unnecessarily obscure embodiments of the present invention. Furthermore, it is to be understood that the various embodiments shown in the Figures are illustrative representations and are not necessarily drawn to scale.

A hybrid laser dicing process involves using a laser to induce defects inside the substrate and laser scribing to pattern the surface of the substrate. The die is then singulated (e.g., via expansion of dicing tape over which the substrate is mounted) along the regions with the laser-induced defects and laser-scribed patterns.

In existing stealth dicing methods, if there is a metal layer in the dicing street (e.g., such as alignment marks or test patterns), the laser used to perform the stealth dicing cannot penetrate through the metal layer to generate the desired defects or cracks. Even if the laser is able to generate defects or cracks, the clustered, non-uniform, or asymmetrical distribution of metal and/or dielectric layers can cause deviation of the crack propagation during tape expansion. Depending on the thickness, mechanical properties, and spatial distribution, the propagation of laser-induced internal defects may result in delamination of dielectric layers and peeling of metal layers. In one example, for a 0.1 µm wavelength infrared laser, the optical reflection at the air/silicon surface is about 30%. Therefore, there is very low linear optical absorption in the silicon, which favors focusing of the laser beam inside the silicon substrate. However, with the introduction of dielectric layers of the silicon substrate, the optical reflection at the interfaces (e.g., at an $SiO_2$/Si or SiN/Si interface) is lower, implying better coupling of the laser beam with the silicon substrate.

Moreover, because the dielectric layer distribution may be non-uniform in the dicing street, the coupling of the laser beam to the silicon substrate becomes nonuniform. Nonuniform coupling of the laser beam typically results in the creation of nonuniform defects or cracks (e.g., nonuniformities in terms of the size and depth of the defects). Deviation of crack propagation can be even more pronounced when there is a through silicon via (TSV) metal interconnection the dicing street. A TSV metal interconnect may act as a discontinuity point in a laser-induced embedded defect array, resulting in a higher likelihood of deviation. Thus, existing stealth dicing methods lack sufficient process control over the laser induced embedded crack propagation, leading to critical defects such as metal peeling and dielectric delamination.

In contrast, embodiments involve application of a laser to a backside of a semiconductor wafer to induce internal defects, and patterning of the front side of the semiconductor wafer with a laser scribing process. The laser scribing process may be used to cleanly remove the device layers (including, e.g., organic and inorganic dielectric layers, and metal layers). As is described in more detail below, using a femtosecond laser to remove the device layers (including the metals and dielectrics) and forming one or more grooves into the silicon substrate may result in improved guidance of the propagation of stealth dicing induced defects or cracks.

Turning to the figures, FIG. 1 illustrates operations in a method 100 of hybrid laser dicing a semiconductor wafer including a plurality of integrated circuits, in accordance with an embodiment of the present invention. In the embodiment of FIG. 1, the method 100 of dicing involves focusing a laser beam inside a substrate (e.g., below the surface of the substrate) in regions between integrated circuits, at operation 102. The internally-focused laser beam induces defects inside the substrate. The defects may include a crack in the region in which the laser is focused, or simply a phase change such as change of a crystalline silicon structure into an amorphous silicon structure, or a crystalline silicon structure to a liquid silicon phase. Because different phases of the same material will have different densities, a phase change is typically accompanied by a volume change in the laser-affected area. The neighboring areas that are unaffected by the laser constrain the laser-affected area and prevent or limit the volume change from occurring, which causes stress in the region of phase change. Laser induced defects may also include hole/pore formation. According to embodiments, the internal (e.g., embedded) defects have a width of less than or equal to 2 µm.

The substrate in which the cracks are induced may include, for example, a semiconductor wafer of a material suitable to withstand a fabrication process and upon which processing layers may be disposed and/or patterned. For example, in one embodiment, a semiconductor wafer may be composed of a group IV-based material such as, but not limited to, crystalline silicon, germanium or silicon/germanium. In a specific embodiment, providing semiconductor wafer includes providing a monocrystalline silicon substrate. In a particular embodiment, the monocrystalline silicon substrate is doped with impurity atoms. In another embodiment, semiconductor wafer or substrate is composed of a III-V material such as, e.g., GaN used in the fabrication of light emitting diodes (LEDs). According to embodiments, the semiconductor wafer has a thickness approximately in the range of 100 µm to 800 µm. In other embodiments, the semiconductor wafer may be less than 100 µm (e.g., 50-60 µm). Furthermore, embodiments may address dicing applications of IC wafers with an acceptable dicing kerf width approximately in the range of 50 µm to 200 µm, and more particularly approximately in the range of 50 µm to 100 µm measured on the wafer front surface. A range of 50-100 µm measured on the wafer front surface corresponds to a typical kerf width measured from the back side of the wafer of approximately 30-50 µm.

The semiconductor wafer or substrate has disposed thereon or therein, as a portion of the integrated circuits, an array of semiconductor devices. Examples of such semiconductor devices include, but are not limited to, memory devices or complimentary metal-oxide-semiconductor (CMOS) transistors fabricated in a silicon substrate and encased in a dielectric layer. A plurality of metal interconnects may be formed above the devices or transistors, and in surrounding dielectric layers, and may be used to electrically couple the devices or transistors to form the integrated circuits. Conductive bumps and passivation layers may be formed above the interconnect layers. Materials making up the dicing streets may be similar to or the same as those materials used to form the integrated circuits. For example, the streets may be composed of layers of dielectric materials, semiconductor materials, and/or metallization. In one embodiment, one or more of the streets includes test devices similar to the actual devices of the integrated circuits.

Figure 2:
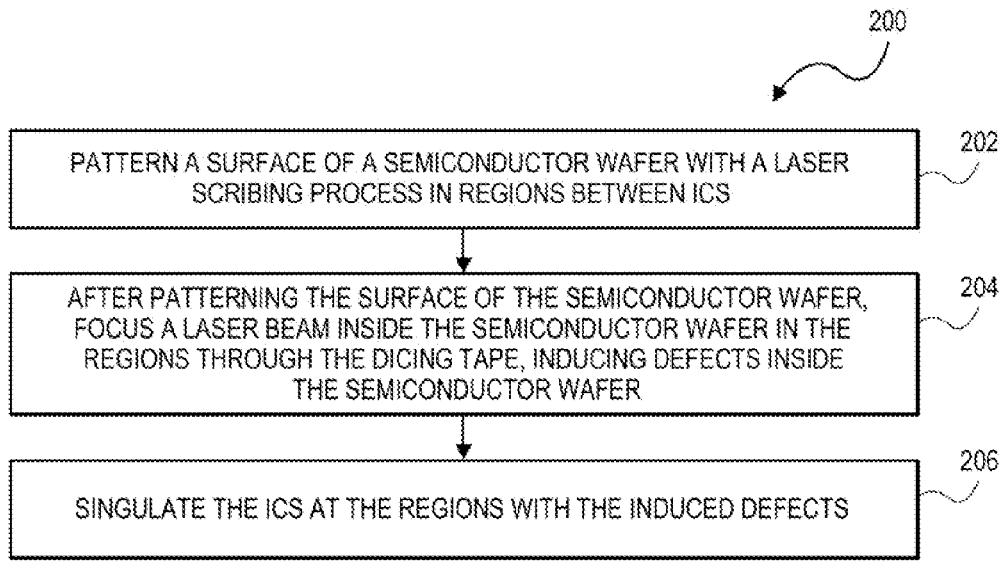
FIG. 2 is a flowchart representing operations in a method of hybrid laser dicing a semiconductor wafer including a plurality of integrated circuits, in accordance with an embodiment of the present invention.
Figure 3:
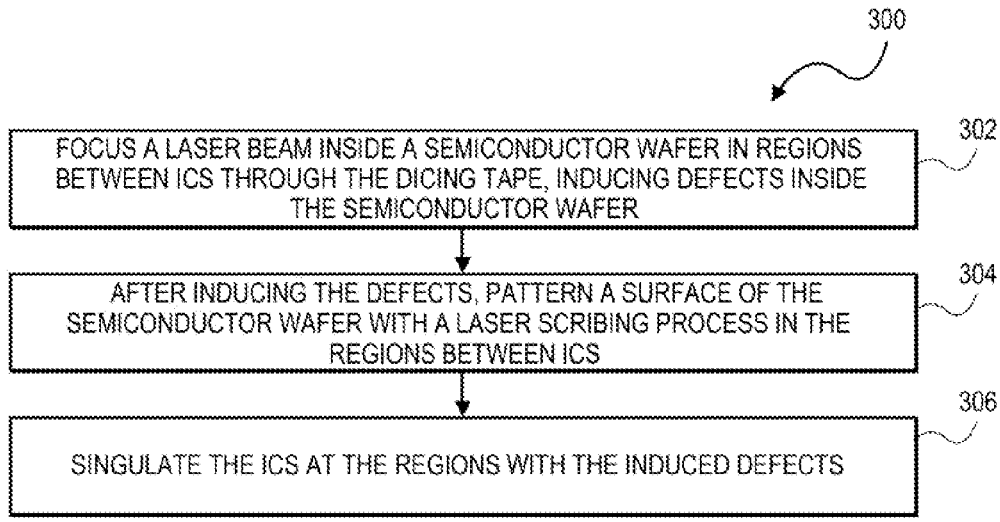
FIG. 3 is a flowchart representing operations in a method of hybrid laser dicing a semiconductor wafer including a plurality of integrated circuits, in accordance with an embodiment of the present invention.

In embodiments involving dicing of a semiconductor wafer, such as depicted in FIGS. 2 and 3, the laser beam is introduced (e.g., applied) from the back side of the semiconductor wafer, which has a smoother surface in the dicing streets than the front side of the semiconductor wafer (e.g., the front side of the semiconductor wafer has a greater surface roughness in the dicing regions than the back side). The greater surface roughness on the front side of the semiconductor wafer may be due to, for example, features such as patterns for testing, alignment, etc. in the regions where the laser is focused (e.g., in the dicing street). Additionally, the front side of the semiconductor wafer typically has a greater surface roughness after laser scribing. According to one embodiment, the side of the semiconductor wafer through which the laser is introduced (e.g., the back side) has a surface roughness of less than or equal to 0.08 µm. Applying the laser beam to the back side of the semiconductor wafer may be achieved by supporting the semiconductor wafer with the front side "down" (e.g., with the front side facing and/or on dicing tape or another support), or with the back side "down."

According to embodiments, the laser beam has a relatively long pulse width, which enables greater thermal stress. The thermal stress from a laser beam having a long pulse width enables inducing defects or cracking with a greater amplitude or size. In one embodiment, the pulse width of the laser beam is greater than or equal to 10 picoseconds. Regarding the wavelength of the laser beam, silicon may transmit a greater percentage of a longer-wavelength laser beam than a shorter-wavelength laser beam. Thus, in one embodiment, the laser beam used to induce the defects inside the substrate has a wavelength greater than 1,000 nanometers.

Although the laser-induced defects combined with tensile stress may be sufficient for die singulation along the regions with defects, delamination and chipping typically still occur, especially in embodiments with metal and/or dielectric layers. In contrast to existing methods, embodiments include an additional laser-scribe operation to pattern a surface of the semiconductor wafer or substrate. For example, returning to FIG. 1, after inducing the internal defects with the laser beam at operation 102, the method 100 involves patterning a surface of the substrate with a laser scribing process in the regions after inducing the defects in the substrate, at operation 104. In one embodiment, the laser used in the laser scribing process is different than the laser used to induce defects inside the substrate. However, embodiments are not limited to the use of different lasers for inducing the internal defects and for the laser-scribing process.

According to embodiments, patterning the semiconductor wafer with the laser scribing process may involve removing a device layer in a dicing region. Removing the device layer in the dicing region may involve removing, e.g., metal and/or dielectric layer(s). In some embodiments, a mask is disposed over the surface of the semiconductor wafer. Such a mask may provide protection during one or more operations in the dicing process. For example, a mask may serve as a debris-collecting sacrificial layer that protects the underlying ICs during the dicing process. In an embodiment that involves mask formation over the surface of the semiconductor wafer prior to dicing, patterning with the laser scribing process may further involve laser scribing the mask.

Unlike some existing techniques that involve stealth dicing, embodiments involve patterning with the laser scribing process, which removes features in the dicing street such as test and/or alignment features. Although removal of such features may be desirable, removal of such features from the front side of the semiconductor wafer may make alignment of subsequent laser processing less accurate. Additionally, laser scribing a semiconductor wafer may make the wafer susceptible to cracking during handling (e.g., during remounting or other processing). Thus, according to embodiments, the laser scribing process to pattern the front side of the semiconductor wafer is performed after inducing the internal defects with a laser.

According to one embodiment, patterning the surface of the substrate involves forming grooves in the device layer, wherein one or more of a metal and dielectric layer is removed in the grooves. In one such embodiment, the groove(s) in the surface of the substrate or semiconductor wafer are approximately aligned with the induced defects in the regions between the integrated circuits. The groove(s) may be continuously scribed lines with well-overlapped laser ablation spots, or discontinuous dotted-line type scribes formed with non-overlapped laser ablation spots or periodically overlapped laser ablation spots. According to one embodiment, for a laser at a given laser pulse repetition frequency, it is a matter of adjusting the motion speed of the laser beam relative to work surface. A continuously scribed groove may have the benefit of being simple in motion speed control, and can be a conservative way to remove fragile device layers on the street. A continuously scribed groove can also establish a consistent stress concentration at the groove tip, facilitating precise separation of dies. However, due to the high laser spot overlap needed, the motion speed may not be high enough to achieve a high throughput. A discontinuously scribed groove has the throughput advantage, but can complicate motion control in the case of periodically overlapped laser spots. Additionally, it may be difficult to ensure the sensitive device layers along street are removed by a discontinuously scribed groove. In some embodiments, have widths in a range of 10-120 µm.

Figure 10A:
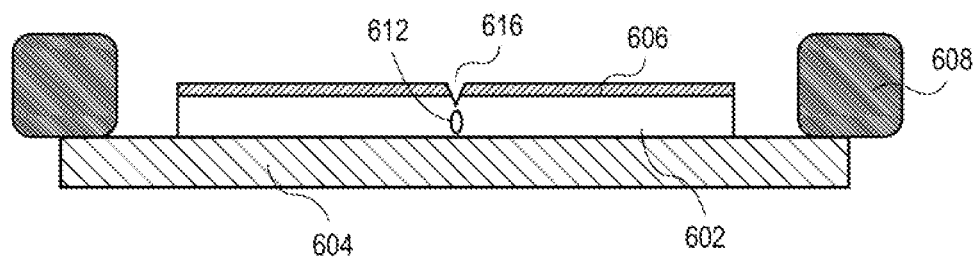
FIGS. 10A-10C illustrate cross-sectional views of a semiconductor wafer including groove(s) in regions between the integrated circuits formed during performance of a method of hybrid laser dicing the semiconductor wafer, in accordance with embodiments of the present invention.
Figure 10B:
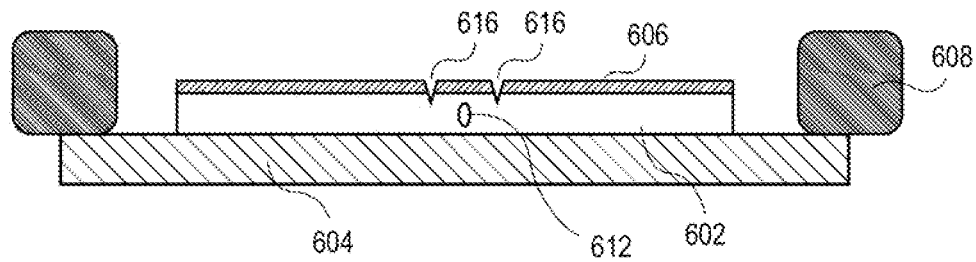
Figure 10C:
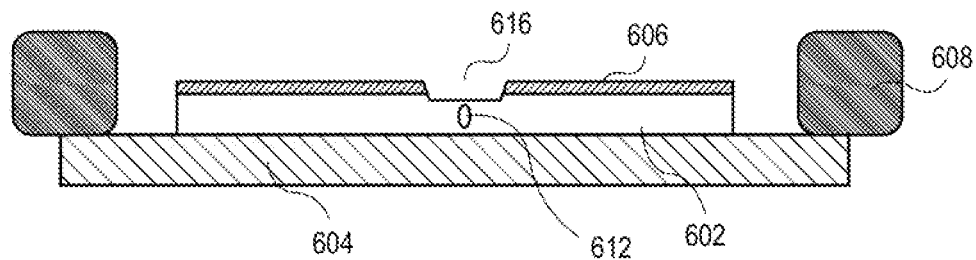

FIGS. 10A-10C illustrate cross-sectional views of a semiconductor wafer including exemplary grooves in regions between the integrated circuits, in accordance with embodiments of the present invention. For example, referring to FIG. 10A, a sharp, narrow groove 616 is formed through the device layer 606 and into the silicon substrate 602. According to embodiments, a sharp, narrow groove results in a higher stress concentration at the tip of the groove. During subsequent singulation (e.g., via tape expansion), the embedded crack tends to propagate to the groove tip, therefore resulting in the crack propagation along the die edges being well guided during singulation. A difficulty with a single sharp groove may be achieving sufficient alignment accuracy relative to the laser-induced defects. If the laser-induced defects and groove are not well-aligned, the groove and the laser-induced defect may propagate along their own paths rather than the groove acting as a guide to laser induced-defect propagation.

FIG. 10B shows another embodiment with grooves 616 on both sides of the induced defects 612. For example, grooves may be in the form of two parallel lines within the dicing street. The two adjacent grooves may then act as a "fire wall," confining propagation of the embedded crack between them. In FIG. 10C, a wide groove 616 is formed through the device layer 606 and into the silicon substrate 602. A wider groove 616 may have the benefit of completely removing test features in the dicing street, while still guiding crack propagation during singulation.

According to embodiments, forming the groove(s) with the laser scribing process involves using a laser having a pulse width in the femtosecond range. Specifically, a laser with a wavelength in the visible spectrum or the ultra-violet (UV) or infra-red (IR) ranges (the three totaling a broadband optical spectrum) may be used to provide a femtosecond-based laser (i.e., a laser with a pulse width on the order of the femtosecond ($10^{-15}$ seconds)). In one embodiment, ablation is not, or is essentially not, wavelength dependent and is thus suitable for metal layers, dielectric layers, and/or a portion of an underlying silicon substrate.

Laser parameters selection, such as pulse width, may be critical to developing a successful laser scribing and dicing process that minimizes chipping, microcracks, and delamination in order to achieve clean laser scribe cuts. As mentioned above, in semiconductor device wafers, many functional layers of different material types (e.g., conductors, insulators, and semiconductors) and thicknesses are typically disposed thereon. Such materials may include, but are not limited to, organic materials such as polymers, metals, or inorganic dielectrics such as silicon dioxide and silicon nitride.

Figure 11:
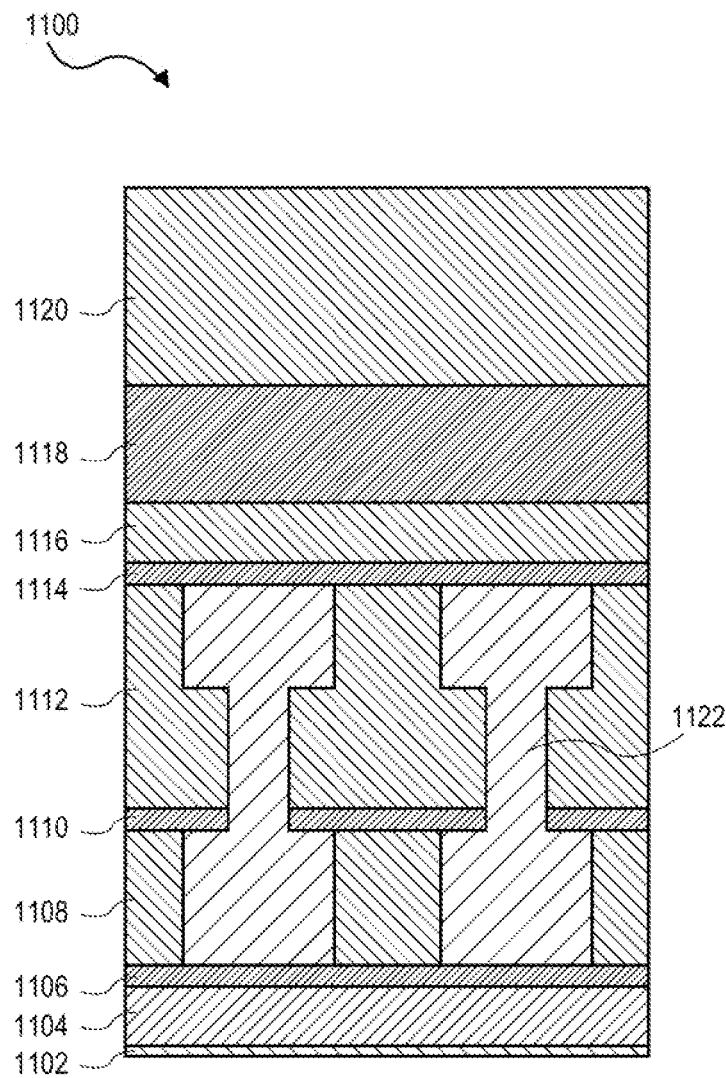
FIG. 11 illustrates a cross-sectional view of a stack of materials that may be present in a street region of a semiconductor wafer or substrate, in accordance with embodiments of the present invention.

A street between individual integrated circuits disposed on a wafer or substrate may include the similar or same layers as the integrated circuits themselves. For example, FIG. 11 illustrates a cross-sectional view of a stack of materials that may be used in a street region of a semiconductor wafer or substrate, in accordance with an embodiment of the present invention. Referring to FIG. 11, a street region 1100 includes the top portion 1102 of a silicon substrate a first silicon dioxide layer 1104, a first etch stop layer 1106, a first low K dielectric layer 1108 (e.g., having a dielectric constant of less than the dielectric constant of 4.0 for silicon dioxide), a second etch stop layer 1110, a second low K dielectric layer 1112, a third etch stop layer 1114, an undoped silica glass (USG) layer 1116, a second silicon dioxide layer 1118, and a layer of photo-resist 1120, with relative thicknesses depicted. Copper metallization 1122 is disposed between the first and third etch stop layers 1106 and 1114 and through the second etch stop layer 1110. In a specific embodiment, the first, second and third etch stop layers 1106, 1110, and 1114 are composed of silicon nitride, while low K dielectric layers 1108 and 1112 are composed of a carbon-doped silicon oxide material.

Under conventional laser irradiation (such as nanosecond-based or picosecond-based laser irradiation), the materials of street 1100 may behave quite differently in terms of optical absorption and ablation mechanisms. For example, dielectric layers (e.g., silicon dioxide layers) are essentially transparent to commercially available laser wavelengths under normal conditions. By contrast, metals, organics (e.g., low K materials), and silicon can couple photons very easily, particularly in response to nanosecond-based or picosecond-based laser irradiation. In an embodiment, however, a femtosecond-based laser process is used to pattern a layer of silicon dioxide, a layer of low K material, and a layer of copper by ablating the layer of silicon dioxide prior to ablating the layer of low K material and the layer of copper. In a specific embodiment, pulses of approximately less than or equal to 500 femtoseconds are used in a femtosecond-based laser irradiation process to remove a mask, a street, and a portion of a silicon substrate.

In accordance with an embodiment of the present invention, suitable femtosecond-based laser processes are characterized by a high peak intensity (irradiance) that usually leads to nonlinear interactions in various materials. In one such embodiment, the femtosecond laser sources have a pulse width approximately in the range of 10 femtoseconds to 500 femtoseconds, although preferably in the range of 100 femtoseconds to 400 femtoseconds. In one embodiment, the femtosecond laser sources have a wavelength approximately in the range of 1600 nanometers to 200, although preferably in the range of 540 nanometers to 250 nanometers. In one embodiment, the laser and corresponding optical system provide a focal spot at the work surface approximately in the range of 3 μm to 15 μm, though preferably approximately in the range of 5 μm to 10 μm.

The spatial beam profile at the work surface may be a single mode (Gaussian) or have a shaped top-hat profile. In an embodiment, the laser source has a pulse repetition rate approximately in the range of 200 kHz to 10 MHz, although preferably approximately in the range of 500 kHz to 5 MHz. In an embodiment, the laser source delivers pulse energy at the work surface approximately in the range of 0.5 μJ to 100 μJ although preferably approximately in the range of 1 μJ to 5 μJ. In an embodiment, the laser scribing process runs along a work piece surface at a speed approximately in the range of 500 mm/sec to 5 m/sec, although preferably approximately in the range of 600 mm/sec to 2 m/sec.

The scribing process may be run in single pass only, or in multiple passes, but, in an embodiment, preferably one to two passes. In one embodiment, the scribing depth in the work piece is approximately in the range of 5 μm to 50 μm deep, preferably approximately in the range of 10 μm to 20 μm deep. The laser may be applied either in a train of single pulses at a given pulse repetition rate or a train of pulse bursts. In an embodiment, the kerf width of the laser beam generated is approximately in the range of 2 μm to 15 μm, although in silicon wafer scribing/dicing preferably approximately in the range of 6 μm to 10 μm, measured at the device/silicon interface.

Laser parameters may be selected with benefits and advantages such as providing sufficiently high laser intensity to achieve ionization of inorganic dielectrics (e.g., silicon dioxide) and to minimize delamination and chipping caused by underlayer damage prior to direct ablation of inorganic dielectrics. Also, parameters may be selected to provide meaningful process throughput for industrial applications with precisely controlled ablation width (e.g., kerf width) and depth. As described above, a femtosecond-based laser is far more suitable to providing such advantages, as compared with picosecond-based and nanosecond-based laser ablation processes. However, even in the spectrum of femtosecond-based laser ablation, certain wavelengths may provide better performance than others. For example, in one embodiment, a femtosecond-based laser process having a wavelength closer to or in the UV range provides a cleaner ablation process than a femtosecond-based laser process having a wavelength closer to or in the IR range. In a specific such embodiment, a femtosecond-based laser process suitable for semiconductor wafer or substrate scribing is based on a laser having a wavelength of approximately less than or equal to 540 nanometers. In a particular such embodiment, pulses of approximately less than or equal to 500 femtoseconds of the laser having the wavelength of approximately less than or equal to 540 nanometers are used. However, in an alternative embodiment, dual laser wavelengths (e.g., a combination of an IR laser and a UV laser) are used.

Returning to FIG. 1, after patterning with the laser scribing process at operation 104, the method 100 involves singulating the integrated circuits at the regions with the induced defects, at operation 106. Expanding the tape typically involves applying a tensile to separate the dies. In other embodiments, other forms of singulation may be used, such as bending the semiconductor wafer along the regions with induced defects and laser scribed grooves, or other suitable means of physically separating the ICs. According to embodiments, tape expansion (or other such methods of singulation) separates the integrated circuits along the laser-induced internal defects or cracks. The laser-scribed grooves help guide the crack propagation along the street and prevent unwanted defects and delamination. The singulated dies may then be subject to post-dicing processing and/or packaged.

FIGS. 2-5 illustrate specific embodiments of the method 100 of FIG. 1. FIGS. 2-5 and corresponding FIGS. 6A-6D, 7A-7D, 8A-8D, and 9A-9D illustrate embodiments where a semiconductor wafer (including a silicon substrate 602 and a device layer 606) is mounted over dicing tape 604 and supported by a frame 608. The frame 608 may include, for example, a support ring to which the dicing tape 604 may be attached, or other frame. Although the following examples include dicing tape attached to a frame, other support structures may be used to support the semiconductor wafer during dicing.

Figure 6A:
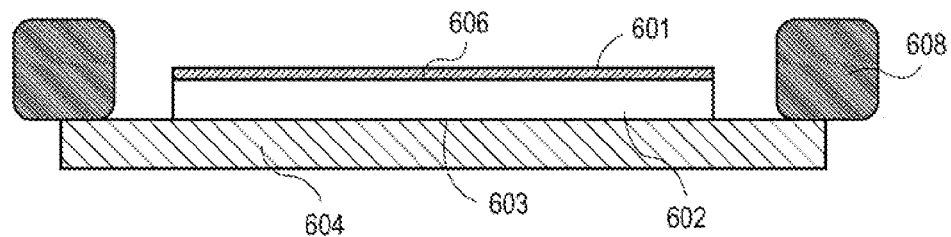
FIGS. 6A-6D illustrate cross-sectional views of a semiconductor wafer including a plurality of integrated circuits during performance of a method of hybrid laser dicing the semiconductor wafer, corresponding to FIG. 2, in accordance with embodiments of the present invention.
Figure 6B:
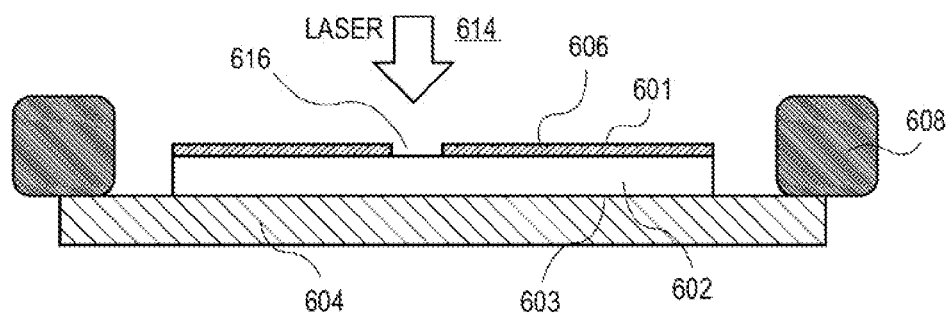

Turning first to FIG. 2 and to corresponding FIGS. 6A-6D, the method 200 involves patterning a surface of a semiconductor wafer with a laser scribing process in regions between ICs, at operation 202. Thus, as illustrated in FIG. 6A, the semiconductor wafer is mounted with its back side 603 on the dicing tape 604. FIG. 6B illustrates formation of the groove 616 with a laser beam 614. Groove formation in operation 202 may be the same or similar to the groove formation described above with respect to operation 104 of FIG. 1. At operation 204 of FIG. 2 and corresponding to FIG. 6C, the method 200 involves applying a laser beam 610 from the back side 603 of the semiconductor wafer through the dicing tape 604, inducing defects inside the semiconductor wafer in regions between the ICs. Thus, in one embodiment, the laser beam is introduced (e.g., applied) from the back side of the semiconductor wafer, which has a smoother surface in the dicing streets than the front side of the semiconductor wafer (e.g., the front side of the semiconductor wafer has a greater surface roughness in the dicing regions than the back side). The greater surface roughness on the front side of the semiconductor wafer may be due to, for example, features such as patterns for testing, alignment, etc. in the regions where the laser is focused (e.g., in the dicing street). According to one embodiment, the side of the semiconductor wafer through which the laser is introduced (e.g., the back side) has a surface roughness of less than or equal to 0.08 µm.

Figure 6C:
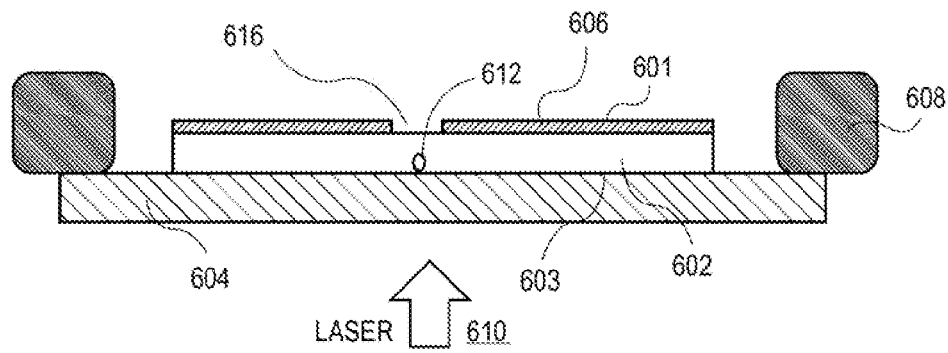
Figure 6D:
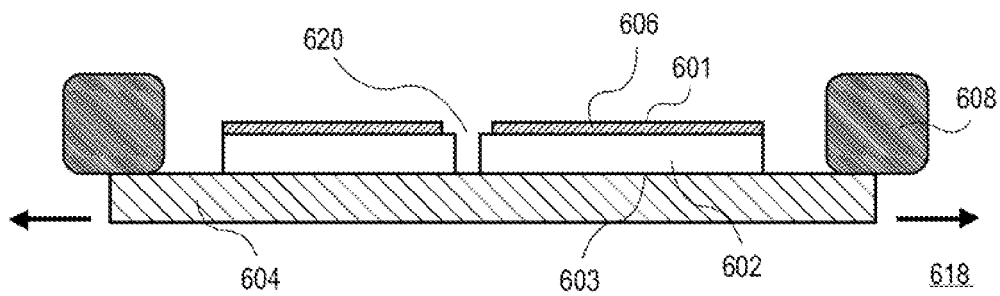

In an embodiment such as in FIG. 2 where the laser beam 610 is applied through the dicing tape 604 (or through another carrier or support), the dicing tape 604 is made from a material that is substantially transparent to the wavelength of the laser beam 610. After inducing the internal defects and forming the grooves, the ICs are singulated at the regions with the induced defects and the groove, at operation 206. FIG. 6D illustrates the application of tensile force (as illustrated by the arrows 618), resulting in singulation of the ICs (illustrated by the gap 620).

Figure 7A:
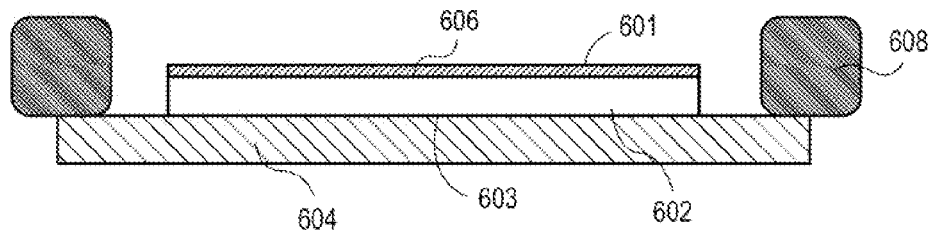
FIGS. 7A-7D illustrate cross-sectional views of a semiconductor wafer including a plurality of integrated circuits during performance of a method of hybrid laser dicing the semiconductor wafer, corresponding to FIG. 2, in accordance with embodiments of the present invention.
Figure 7B:
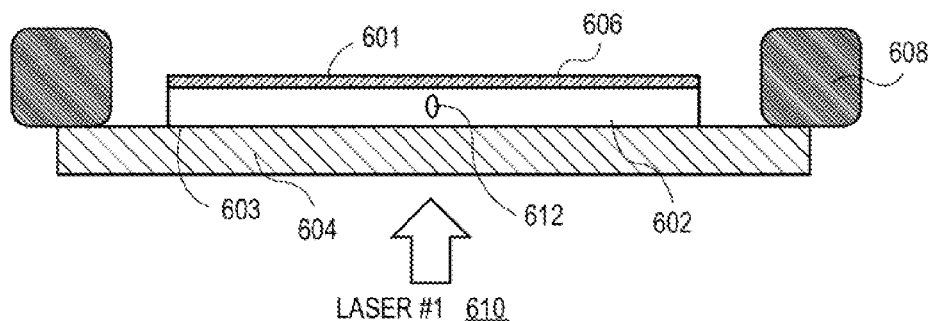
Figure 7C:
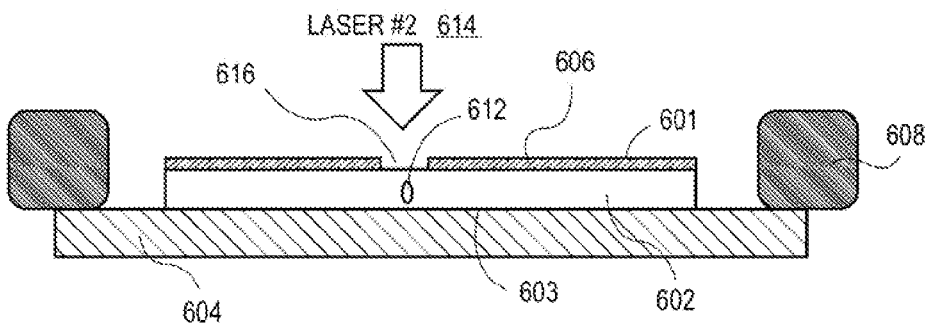
Figure 7D:
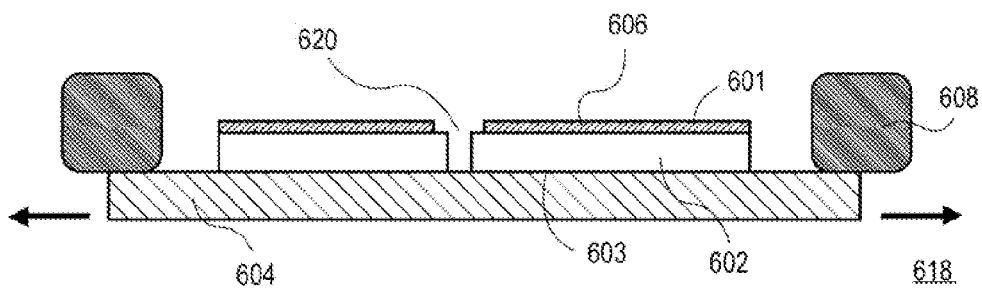

FIG. 3, which corresponds to FIGS. 7A-7D, illustrates an embodiment in which the defects inside the semiconductor wafer are induced before laser scribing. As illustrated in FIG. 7A, the semiconductor wafer is mounted with its back side 603 on the dicing tape 604. The method 300 may then involve application of the laser beam 610 from the back side 603 through the dicing tape 604 at operation 302, as illustrated in FIG. 7B. After inducing the internal defects with the laser 610, the method 300 may involve patterning the front side 601 to form a groove 616, at operation 202, and as illustrated in FIG. 6C. FIG. 6D illustrates the subsequent application of tensile force (as illustrated by the arrows 618), resulting in singulation of the ICs (illustrated by the gap 620).

Figure 4:
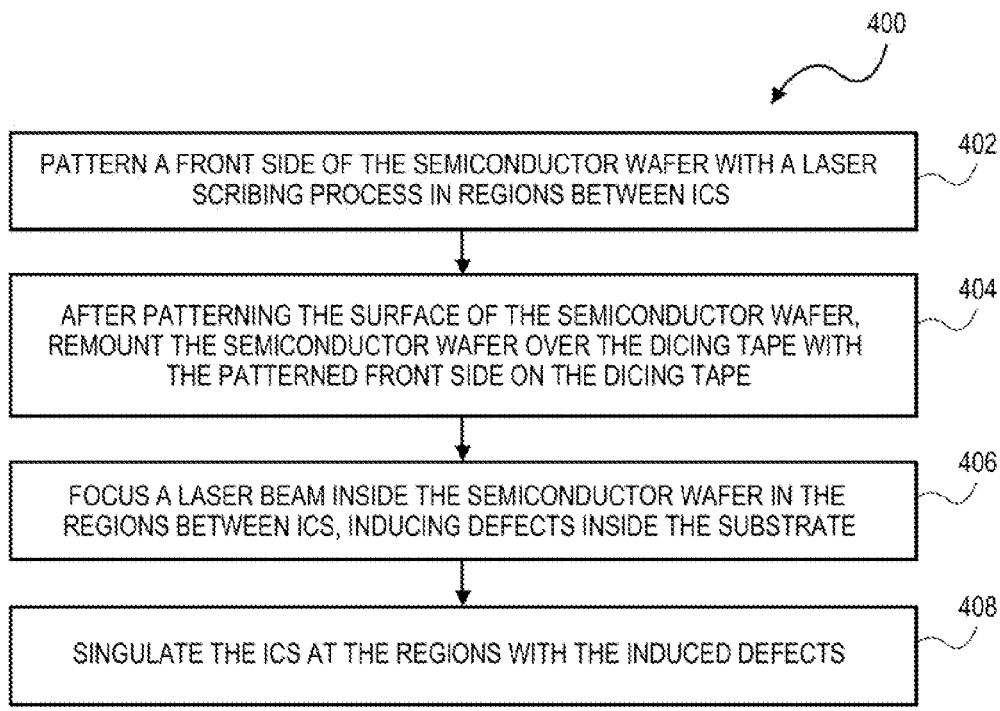
FIG. 4 is a flowchart representing operations in a method of hybrid laser dicing a semiconductor wafer including a plurality of integrated circuits, in accordance with an embodiment of the present invention.
Figure 8A:
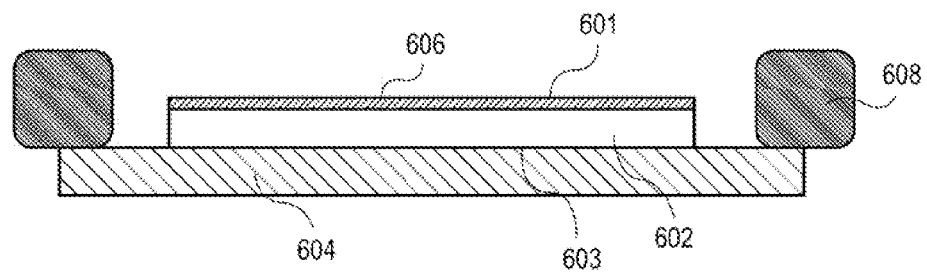
FIGS. 8A-8D illustrate cross-sectional views of a semiconductor wafer including a plurality of integrated circuits during performance of a method of hybrid laser dicing the semiconductor wafer, corresponding to FIG. 3, in accordance with embodiments of the present invention.
Figure 8B:
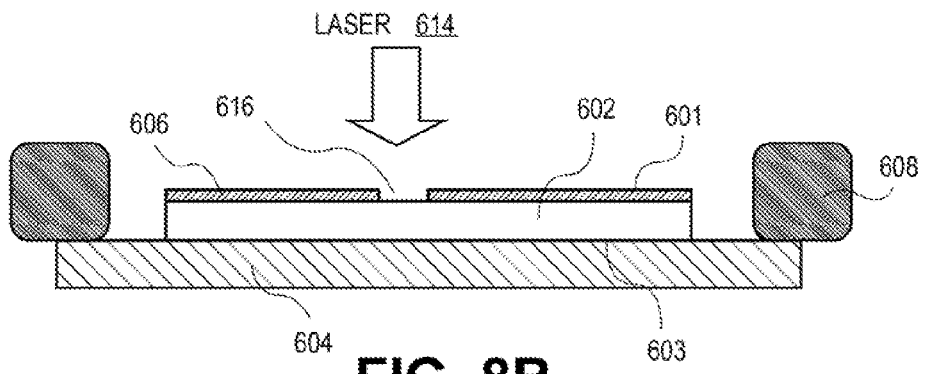
Figure 8C:
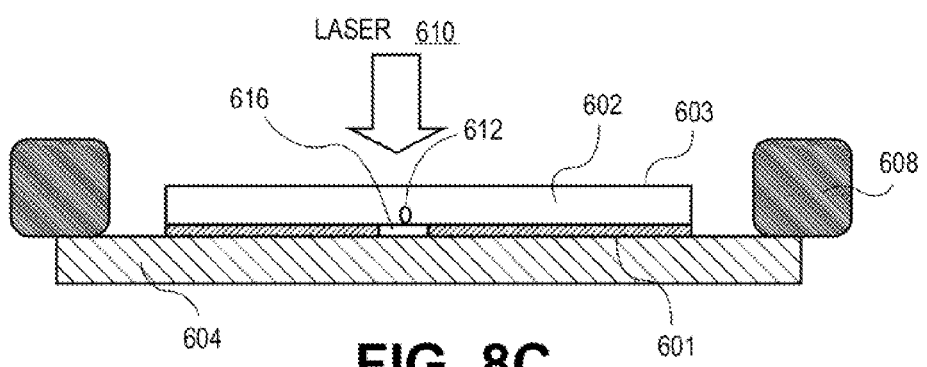
Figure 8D:
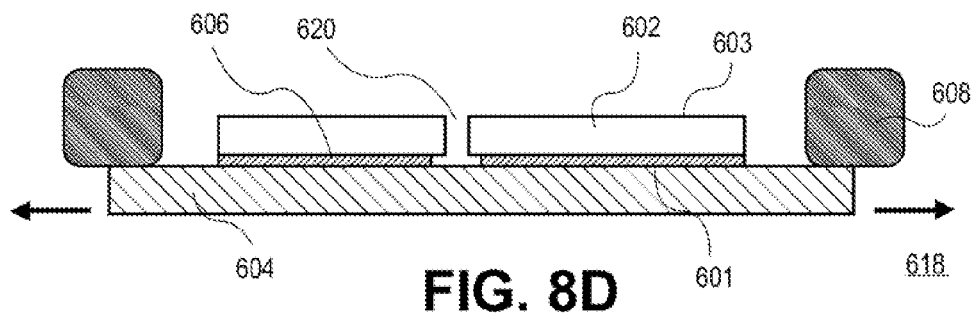

Turning to FIG. 4 and to corresponding FIGS. 8A-8D, the method 400 begins with a semiconductor wafer mounted with its back side 603 on dicing tape 604. At operation 402, and as illustrated in FIG. 8A, a groove 616 is formed on the front side 601 of the semiconductor wafer with a laser scribing process in regions between ICs. At operation 404, and corresponding to FIG. 8C, the semiconductor wafer is remounted over the dicing tape 604 with the grooved front side 603 on the dicing tape 604. At operation 406, which also corresponds to FIG. 8C, the laser beam 610 is applied from the back side 603 after forming the groove 616, inducing defects 612 inside the semiconductor wafer in the regions. FIG. 8D illustrates the subsequent application of tensile force (as illustrated by the arrows 618), resulting in singulation of the ICs (illustrated by the gap 620), at operation 408.

Figure 5:
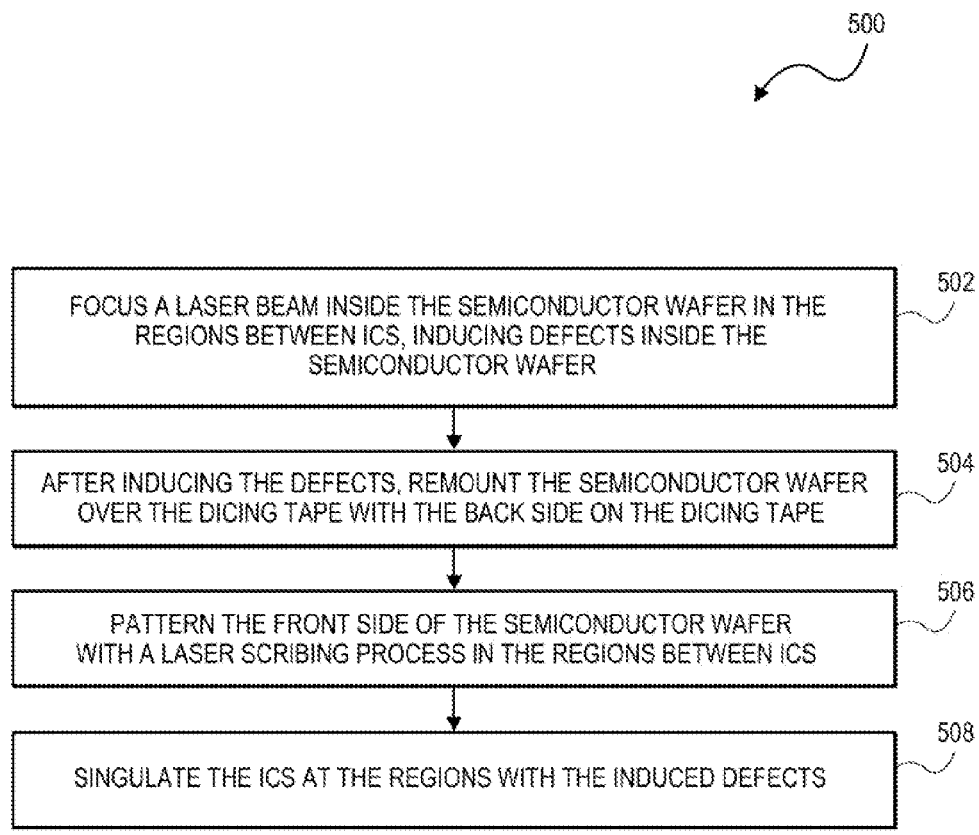
FIG. 5 is a flowchart representing operations in a method of hybrid laser dicing a semiconductor wafer including a plurality of integrated circuits, in accordance with an embodiment of the present invention.
Figure 9A:
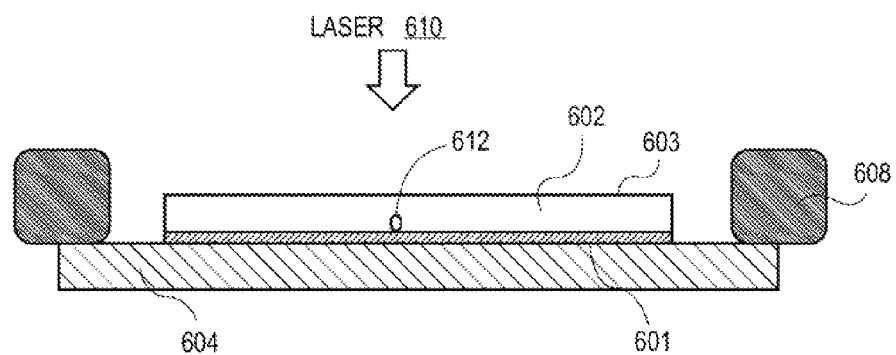
FIGS. 9A-9D illustrate cross-sectional views of a semiconductor wafer including a plurality of integrated circuits during performance of a method of hybrid laser dicing the semiconductor wafer, corresponding to FIG. 2, in accordance with embodiments of the present invention.
Figure 9B:
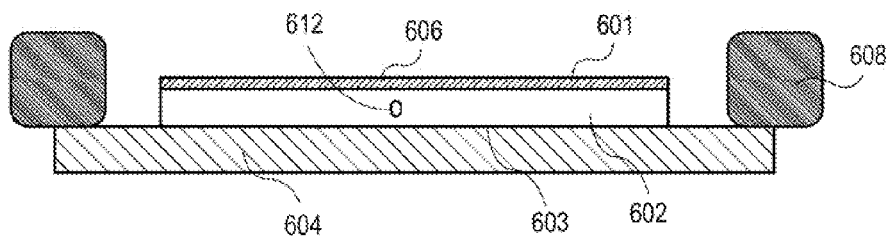
Figure 9C:
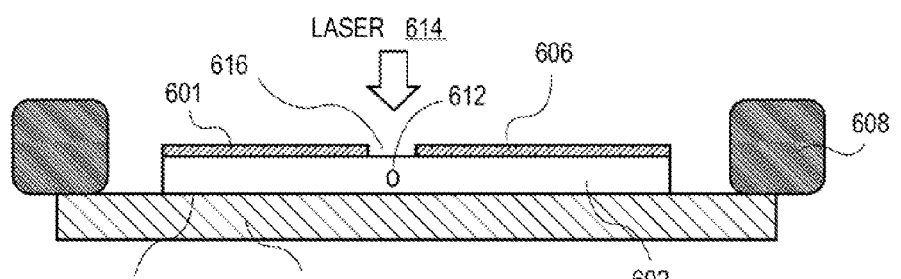
Figure 9D:
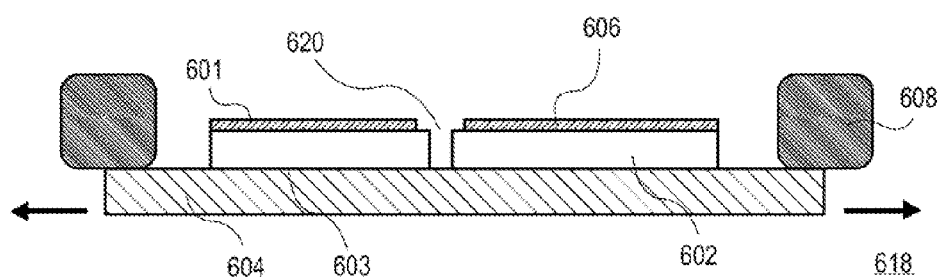

Turning to FIG. 5 and to corresponding FIGS. 9A-9D, the method 500 begins with a semiconductor wafer mounted with its front side 601 on dicing tape 604, as illustrated in FIG. 9A. At operation 502, the laser beam 610 is applied from the back side 601, inducing defects inside the semiconductor wafer in the regions between the ICs. At operation 504, the semiconductor wafer is remounted with its back side 603 on the dicing tape 604, as illustrated in FIG. 9B. A groove 616 is then formed on the front side 601 of the semiconductor wafer with a laser scribing process in the regions after inducing the defects with the laser beam 610, at operation 506 and as illustrated in FIG. 9C. FIG. 9D illustrates the subsequent application of tensile force (as illustrated by the arrows 618), resulting in singulation of the ICs (illustrated by the gap 620), at operation 508.

Figure 12:
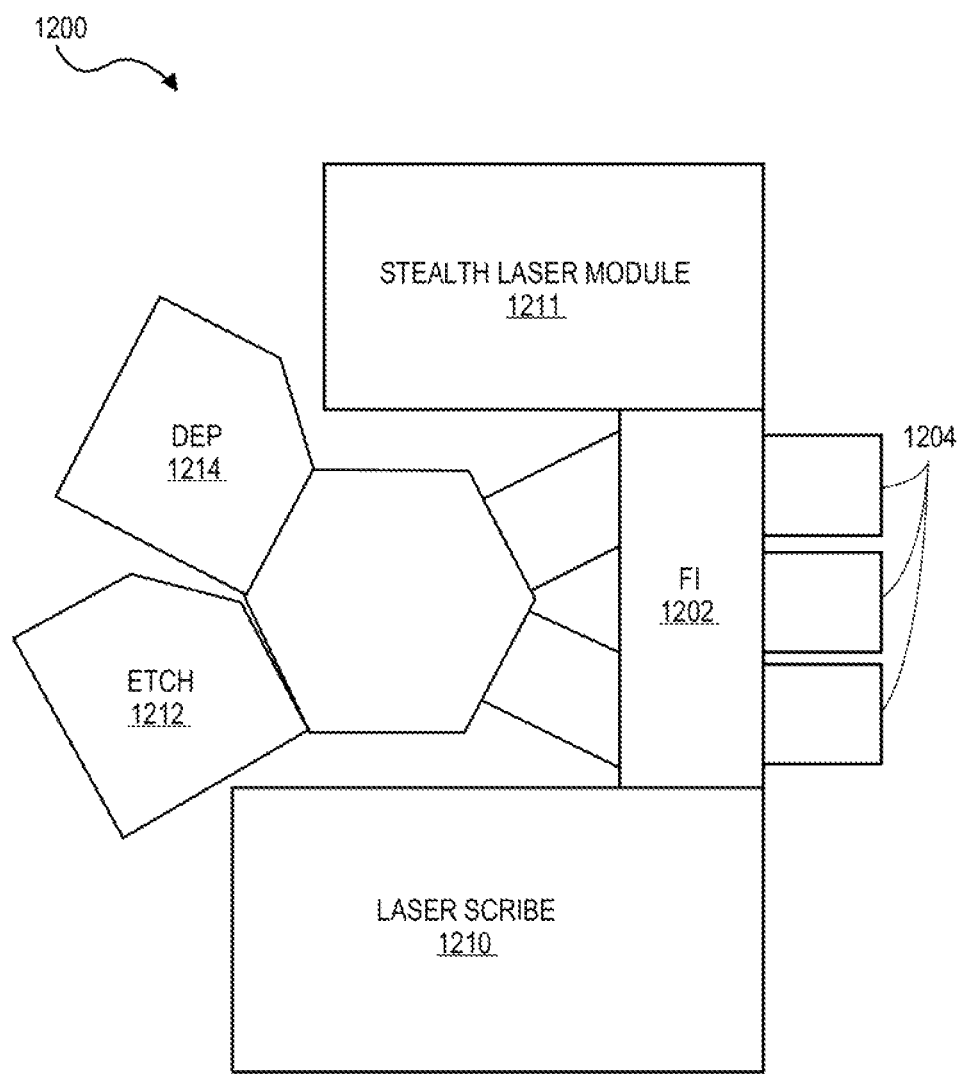
FIG. 12 illustrates a block diagram of a tool layout for hybrid dicing of wafers or substrates, in accordance with embodiments of the present invention.

A single process tool may be configured to perform many or all of the operations in a hybrid laser dicing process. For example, FIG. 12 illustrates a block diagram of a tool layout for hybrid laser dicing, in accordance with an embodiment of the present invention. Referring to FIG. 12, a process tool 1200 includes a factory interface 1202 (FI) having a plurality of load locks 1204 coupled therewith. A laser scribe apparatus 1211 is coupled to the factory interface 1202. In an embodiment, the laser scribe apparatus 1210 houses a laser. In one such embodiment, the laser is a femtosecond-based laser. The laser is suitable for forming grooves such as in the hybrid laser dicing processes described above. In one embodiment, a moveable stage is also included in the laser scribe apparatus 1210, the moveable stage configured for moving a wafer or substrate (or a carrier thereof) relative to the laser. In a specific embodiment, the laser is also moveable.

The process tool 1200 may also include a stealth laser module 1211. According to one embodiment, the stealth laser module 1211 is configured to focus a laser beam inside the substrate in regions between the integrated circuits, inducing defects inside the substrate in the regions. According to one embodiment, the stealth laser module 1211 may include a laser having a wavelength greater than 1000 nanometers and a laser pulse width greater than or equal to 10 picoseconds. In some embodiments, the process tool 1200 may also include one or more other process modules, such as a deposition module 1214 and etch module 1212. A deposition module may be used for forming a mask over the semiconductor wafer, and may include any appropriate type of deposition module (e.g., spin-coating, lamination, screen printing, etc.). The process tool 1200 may also include a tape extender (not shown) configured to stretch the tape over which the substrate is mounted, singulating the integrated circuits at the regions with the induced defects.

The factory interface 1202 may be a suitable atmospheric port to interface between an outside manufacturing facility with the laser modules 1210 and 1211, and other modules such as a deposition module 1214 and etch module 1212. The factory interface 1202 may include robots with arms or blades for transferring wafers (or carriers thereof) from storage units (such as front opening unified pods) into the modules of the process tool 1200.

Figure 13:
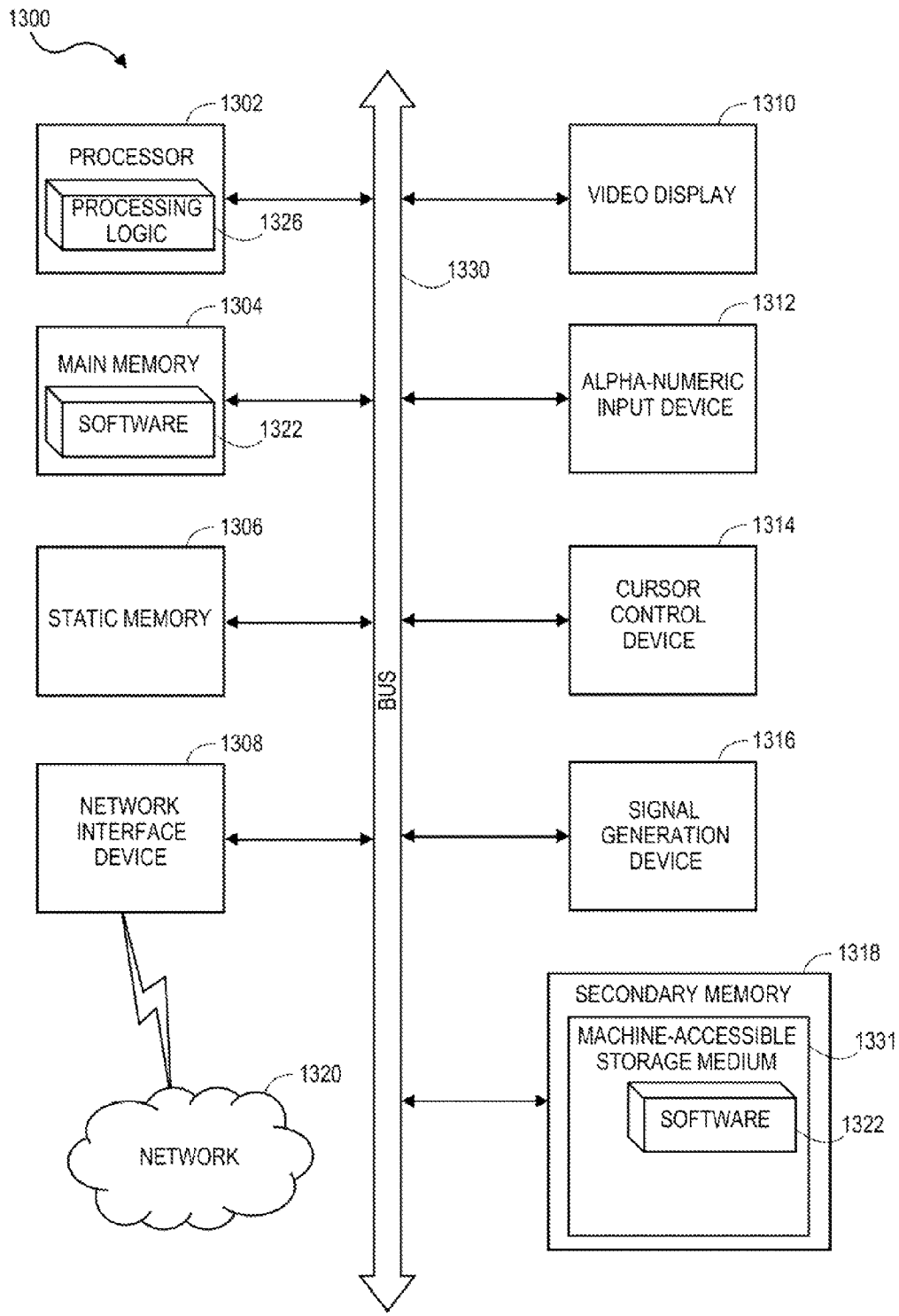
FIG. 13 illustrates a block diagram of an exemplary computer system which controls automated performance of one or more operations in the hybrid laser dicing method described herein, in accordance with an embodiment of the present invention.

FIG. 13 illustrates a computer system 1300 within which a set of instructions, for causing the machine to execute one or more of the scribing methods discussed herein may be executed. The exemplary computer system 1300 includes a processor 1302, a main memory 1304 (e.g., read-only memory (ROM), flash memory, dynamic random access memory (DRAM) such as synchronous DRAM (SDRAM) or Rambus DRAM (RDRAM), etc.), a static memory 1306 (e.g., flash memory, static random access memory (SRAM), etc.), and a secondary memory 1318 (e.g., a data storage device), which communicate with each other via a bus 1330.

Processor 1302 represents one or more general-purpose processing devices such as a microprocessor, central processing unit, or the like. More particularly, the processor 1302 may be a complex instruction set computing (CISC) microprocessor, reduced instruction set computing (RISC) microprocessor, very long instruction word (VLIW) microprocessor, etc. Processor 1302 may also be one or more special-purpose processing devices such as an application specific integrated circuit (ASIC), a field programmable gate array (FPGA), a digital signal processor (DSP), network processor, or the like. Processor 1302 is configured to execute the processing logic 1326 for performing the operations and steps discussed herein.

The computer system 1300 may further include a network interface device 1308. The computer system 1300 also may include a video display unit 1310 (e.g., a liquid crystal display (LCD) or a cathode ray tube (CRT)), an alpha-numeric input device 1312 (e.g., a keyboard), a cursor control device 1314 (e.g., a mouse), and a signal generation device 1316 (e.g., a speaker).

The secondary memory 1318 may include a machine-accessible storage medium (or more specifically a computer-readable storage medium) 1331 on which is stored one or more sets of instructions (e.g., software 1322) embodying any one or more of the methodologies or functions described herein. The software 1322 may also reside, completely or at least partially, within the main memory 1304 and/or within the processor 1302 during execution thereof by the computer system 1300, the main memory 1304 and the processor 1302 also constituting machine-readable storage media. The software 1322 may further be transmitted or received over a network 1320 via the network interface device 1308.

While the machine-accessible storage medium 1331 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media, and other non-transitory machine-readable storage medium.

Thus, described herein are a method and system of hybrid laser dicing. Embodiments enable dicing of ICs with limited chipping and delamination, in contrast to existing stealth dicing methods. Additionally, embodiments may enable a physical-only dicing process (e.g., no plasma or chemical etching), and therefore eliminate masking requirements and post-processing requirements that may be associated with removal of post-etch chemical residue. It is to be understood that the above description is intended to be illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A method of dicing a substrate comprising a plurality of integrated circuits, the method comprising:

focusing a laser beam inside the substrate in regions between the integrated circuits, inducing defects inside the substrate in the regions, wherein focusing the laser beam inside the substrate comprises applying the laser beam from a back side of the substrate;

patterning a front side of the substrate with a laser scribing process in the regions, wherein the front side of the substrate has a greater surface roughness in the regions than the back side of the substrate; and singulating the integrated circuits at the regions with the induced defects.

2. The method of claim 1, wherein the defects are induced with the laser beam prior to patterning the surface of the substrate with the laser scribing process.

3. The method of claim 1, wherein the defects are induced with the laser beam after patterning the surface of the substrate with the laser scribing process.

4. The method of claim 1, wherein:
the substrate comprises a semiconductor wafer, and wherein the front side of the semiconductor wafer comprises a device layer; and
patterning the surface of the substrate comprises forming grooves in the device layer, wherein one or more of a metal and dielectric layer is removed in the grooves.

5. The method of claim 4, wherein focusing the laser beam inside the semiconductor wafer comprises applying the laser beam from the back side of the semiconductor wafer while the front side of the semiconductor wafer is mounted on dicing tape.

6. The method of claim 5, further comprising remounting the semiconductor wafer with the back side down after inducing the defects and before patterning the front side of the semiconductor wafer.

7. The method of claim 4, wherein focusing the laser beam inside the semiconductor wafer comprises applying the laser beam from the back side of the semiconductor wafer through dicing tape over which the semiconductor wafer is mounted.

8. The method of claim 4, wherein forming the groove comprises forming the groove through the metal and the dielectric layer and into a silicon substrate.

9. The method of claim 4, wherein forming the grooves comprises forming the grooves through the metal and the dielectric layer and into a silicon substrate that removes test patterns in the regions.

10. The method of claim 1, wherein the patterning the surface of the substrate comprises:
forming grooves through a metal and/or dielectric layer and into a silicon substrate on both sides of the induced defects.

11. The method of claim 1, wherein singulating the integrated circuits at the regions with the induced defects comprises expanding tape over which the substrate is mounted.

12. The method of claim 1, wherein the laser beam focused inside the substrate comprises a laser having a wavelength greater than 1000 nanometers and a laser pulse width greater than or equal to 10 picoseconds.

13. The method of claim 1, wherein patterning the surface of the substrate comprises direct writing a pattern with a femtosecond laser having a wavelength less than or equal to 1600 nanometers and a laser pulse width less than or equal to 1000 femtoseconds.

14. A method of dicing a semiconductor wafer comprising a plurality of integrated circuits, the method comprising:
focusing a laser beam inside the semiconductor wafer in regions between the integrated circuits, inducing defects inside the semiconductor wafer in the regions; and
forming one or more grooves in a device layer of the semiconductor wafer with a laser scribing process in the regions after inducing the defects in the semiconductor wafer, wherein forming the one or more grooves in the device layer comprises direct writing a pattern with a femtosecond laser having a wavelength less than or equal to 1600 nanometers and a laser pulse width less than or equal to 1000 femtoseconds.

15. The method of claim 14, wherein:
forming grooves in the device layer comprises removing one or more of a metal and dielectric layer in the grooves.

16. The method of claim 14, wherein the laser beam focused inside the semiconductor wafer comprises a laser having a wavelength greater than 1000 nanometers and a laser pulse width greater than or equal to 10 picoseconds.

17. A method of dicing a semiconductor wafer comprising a plurality of integrated circuits, the method comprising:
focusing a laser beam inside the semiconductor wafer in regions between the integrated circuits, inducing defects inside the semiconductor wafer in the regions, wherein the laser beam focused inside the semiconductor wafer comprises a laser having a wavelength greater than 1000 nanometers and a laser pulse width greater than or equal to 10 picoseconds; and
forming one or more grooves in a device layer of the semiconductor wafer with a laser scribing process in the regions after inducing the defects in the semiconductor wafer.

18. The method of claim 17, wherein forming the one or more grooves in the device layer comprises direct writing a pattern with a femtosecond laser having a wavelength less than or equal to 1600 nanometers and a laser pulse width less than or equal to 1000 femtoseconds.

19. The method of claim 17, wherein forming the one or more grooves comprises forming the one or more grooves through metal and dielectric layer and into a silicon substrate.

20. The method of claim 17, wherein forming the one or more grooves comprises removing test patterns in the regions.

* * * * *